US011158225B2

(12) United States Patent
Liao et al.

(10) Patent No.: US 11,158,225 B2
(45) Date of Patent: Oct. 26, 2021

(54) DISPLAY DEVICE WITH IMPROVED PIXEL ELECTRODE CHARGING

(71) Applicant: AU OPTRONICS CORPORATION, Hsin-Chu (TW)

(72) Inventors: Wei-Chien Liao, Hsin-Chu (TW); Yu-Jen Chen, Hsin-Chu (TW); Meng-Chieh Tsai, Hsin-Chu (TW)

(73) Assignee: AU OPTRONICS CORPORATION, Hsin-Chu (TW)

( * ) Notice: Subject to any disclaimer, the term of this patent is extended or adjusted under 35 U.S.C. 154(b) by 0 days.

(21) Appl. No.: 16/684,664

(22) Filed: Nov. 15, 2019

(65) Prior Publication Data

US 2020/0160771 A1 May 21, 2020

(30) Foreign Application Priority Data

Nov. 16, 2018 (TW) .................................. 107140898

(51) Int. Cl.
*G09G 3/20* (2006.01)
*H01L 27/12* (2006.01)
(52) U.S. Cl.
CPC ............. *G09G 3/20* (2013.01); *H01L 27/124* (2013.01); *G09G 2300/08* (2013.01); *G09G 2310/0275* (2013.01)
(58) Field of Classification Search
CPC ................. G09G 3/20; G09G 2300/08; G09G 2310/0275; H01L 27/124
USPC .......................................................... 345/55
See application file for complete search history.

(56) References Cited

U.S. PATENT DOCUMENTS

| 10,074,332 | B2 | 9/2018 | Chi et al. | |
|---|---|---|---|---|
| 2006/0001638 | A1* | 1/2006 | Jeon | G09G 3/3677 345/100 |
| 2011/0169787 | A1* | 7/2011 | Chen | G09G 3/3648 345/204 |
| 2014/0362064 | A1 | 12/2014 | Kuo et al. | |
| 2016/0299392 | A1* | 10/2016 | Cheng | G02F 1/134309 |
| 2018/0061351 | A1* | 3/2018 | Chi | G09G 3/3688 |

FOREIGN PATENT DOCUMENTS

| CN | 1744184 A | 3/2006 |
|---|---|---|
| CN | 101604503 A | 12/2009 |
| CN | 106814482 A | 6/2017 |
| CN | 108538236 A | 9/2018 |
| TW | 201447859 A | 12/2014 |

OTHER PUBLICATIONS

TW OA issued on Jan. 30, 2020.
CNIPA has issued the Office Action for the corresponding China application dated Dec. 25, 2020.
China Patent Office "Office Action" dated Jun. 10, 2021, China.

\* cited by examiner

*Primary Examiner* — Jonathan M Blancha
(74) *Attorney, Agent, or Firm* — WPAT, PC

(57) ABSTRACT

A display device includes a plurality of pixel electrodes arranged in an array. A first switch electrically connected to a first pixel electrode of the pixel electrodes. A second switch electrically connected to a second pixel electrode of the pixel electrodes. The second switch is electrically connected between the first switch and a data line, and the first pixel electrode and the first pixel electrode are respectively located at two row of the pixel electrodes that are not adjacent to each other.

20 Claims, 8 Drawing Sheets

DISPLAY DEVICE WITH IMPROVED PIXEL ELECTRODE CHARGING

BACKGROUND

1. Technical Field

This disclosure relates to an electrical device, in particular, a display device.

2. Description of the Related Art

Along with the rapid development of electrical technology, display devices such as mobile phones and computers have been widely applied in our daily lives.

Generally speaking, a display device may comprise a gate drive circuit, a source drive circuit, and a pixel array circuit. The gate drive circuit may sequentially provide a plurality of gate signals to the pixel circuits, so as to sequentially switch on the switching transistors of the pixel circuits row by row. The source drive circuit may provide a plurality of data signals to the pixel circuits switched on by the switching transistors, so the pixel circuits may conduct display operation based on the data signals.

SUMMARY

One aspect of the present invention relates to a display device. According to one embodiment of the present invention, a display device comprises: a plurality of pixel electrodes arranged in an array; a first switch electrically connected to a first pixel electrode of the plurality of pixel electrodes; and a second switch electrically connected to a second pixel electrode of the plurality of pixel electrodes; the second switch is electrically connected between the first switch and a data line, and the first pixel electrode and the second pixel electrode are respectively located at two rows of the pixel electrodes that are not adjacent to each other.

Another aspect of the present invention relates to a display device. According to one embodiment of the present invention, a display device comprises: a substrate, a plurality of pixel electrodes, and a first data transmission line. The plurality of pixel electrodes are arranged in an array. The plurality of pixel electrodes comprise a first pixel electrode and a second pixel electrode, wherein the first pixel electrode and the second pixel electrode are respectively located at two columns of the pixel electrodes; moreover, the first pixel electrode and the second pixel electrode are respectively located at two rows of the pixel electrodes that are not adjacent to each other. The first data transmission line is configured to connect the first pixel electrode and the second pixel electrode, wherein orthogonal projection of the first data transmission line on the substrate is roughly between two adjacent pixel electrodes of the plurality of pixel electrodes By applying one of the embodiments described above, the first switch and the second switch that are respectively located at two rows of the pixel electrodes which are not adjacent to each other may be used to electrically connect the data line and the first pixel electrode, preventing the first pixel electrode from being insufficiently charged.

BRIEF DESCRIPTION OF THE DRAWINGS

To make the objects and advantages of the present invention described above easier to understand, the drawings will be briefly described below.

DETAILED DESCRIPTION OF THE PREFERRED EMBODIMENT

In the following specification, the invention will be described with reference to specific embodiments thereof. It will, however, be evident that various modifications and changes may be made thereto, without departing from the broader spirit and scope of the invention.

It should be understood that, the terms "first", "second", "third", etc. do not refer to a specific order or sequence, nor are they used to limit the present invention, but are merely used to distinguish elements or operations described with the same technical terms from each other.

The terms "connected" or "electrically connected" used in this disclosure may mean two or more elements being physically/electrically connected to each other directly or indirectly. The term "electrically connected" may further mean that two or more elements operate or interact with one another.

The terms "including", "comprising," and variations thereof mean "including but not limited to", unless expressly specified otherwise.

The term "and/or" used herein includes any and all combinations of one or more of the associated listed items.

The terms "about", "approximate" or "essentially" used in the present specification are used to modify a quantity which can tolerate a small amount of deviation or error, but such small amount of deviation or error do not change the nature of the quantity.

Unless otherwise defined, all terms (including technical and scientific terms) used herein have the same meaning as commonly understood by one of ordinary skill in the art to which the present invention belongs. Some terms will be described in the following text or other places in this disclosure to provide extra guidance to the person ordinarily skilled in this art.

Figure 1:
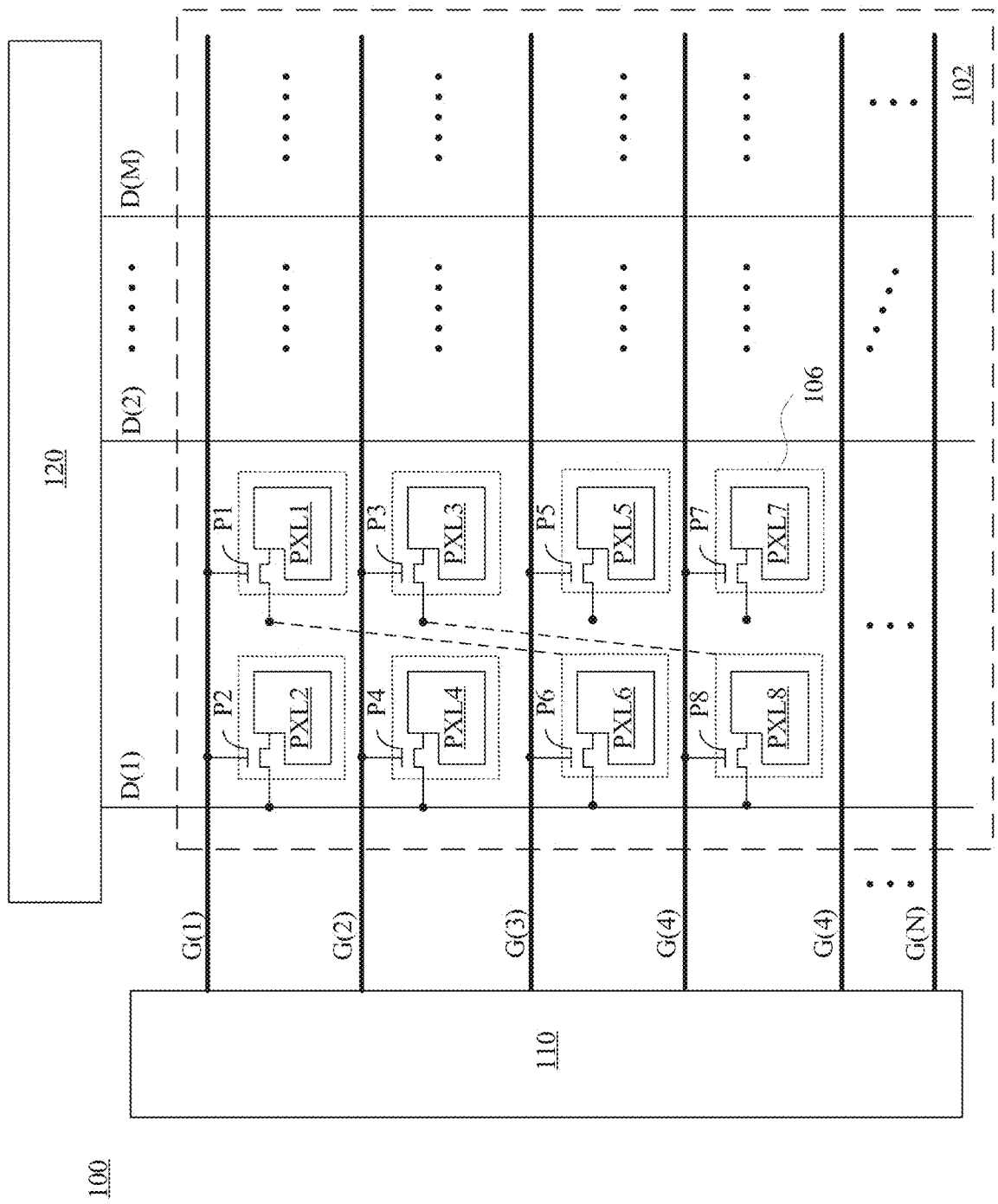
FIG. 1 illustrates a schematic view of a display device according to an embodiment of the present invention.

FIG. 1 illustrates a schematic view of a display device 100 according to an embodiment of the present invention. Display device 100 may comprise the gate drive circuit 110, the source drive circuit 120, and the pixel array 102. The pixel array 102 may comprise a plurality of pixel circuits 106 arranged in an array, and the pixel circuits 106 may comprise the switches P1-P8 and the pixel electrodes PXL1-PXL8. The gate drive circuit 110 may sequentially provide a plurality of gate signals G(1), . . . , G(N) to the pixel circuits 106 in the pixel array 102, so as to switch on the switches P1-P8 of the pixel circuits 106, wherein N is a natural number. In one embodiment, the gate signal G(1), . . . , G(N) are sequentially delayed by one line time (such as the line time LT shown in FIG. 5). The source drive circuit 120 may generate a plurality of data voltages D(1), . . . , D(M) and provide these data voltages D(1), . . . , D(M) through a plurality of data lines to corresponding pixel electrodes PXL1-PXL8, causing the pixel circuits 106 to conduct display operation based on the data voltages D(1), . . . , D(M), wherein M is a natural number. As a result, display device 100 may display images.

In one embodiment, a data line may provide data voltage to two rows of the pixel circuits 106. In one embodiment, two rows of the pixel circuits 106 is roughly disposed between two data lines that are adjacent to each other. In one embodiment, a data line sends data voltage to the second row of the pixel circuits 106 through the first row of the pixel circuits 106.

For example, in one embodiment, a data line may send data voltage D(1) to the pixel circuit 106 having the switch P1 through the pixel circuit 106 having the switch P6. In one embodiment, the pixel circuit 106 having the switch P6 and the pixel circuit 106 having the switch P1 are located at two rows of the pixel array 102 that are not adjacent to each other. In other words, at least one row (such as the row of the pixel circuits 106 corresponding to the switches P3 and P4) of the pixel circuits is between the pixel circuit 106 having the switch P6 and the pixel circuit 106 having the switch P1. In this embodiment, the switch P6 is electrically connected between the switch P1 and the data line that provides the data voltage D(1), so as to deliver the data voltage D(1) to the switch P1.

Similarly, a data line may also send data voltage D(1) to the pixel circuit 106 having the switch P3 through the pixel circuit 106 having the switch P8. The related description is not repeated herein.

With the disposition described above, a delay of two line times exist between the gate signal G(3) received by the control terminal of the switch P6 and the gate signal G(1) received by the control terminal of the switch P1, preventing insufficient charging time of the pixel electrode PXL1 (charged by the data voltage D(1)). Related details will be described below.

In addition, it should be noted that, although in the embodiment described above, the data line sends data voltage D(1) to the pixel circuit 106 having the switch P1 through the pixel circuit 106 having the switch P6, in other embodiments, the data line may send data voltage D(1) to the pixel circuit 106 having the switch P1 through the pixel circuit 106 having the switch P8 or any other pixel circuit 106 in the same row. In other words, through a pixel circuit 106, a data line may send a data voltage to another pixel circuit 106 that is located two rows away (from the pixel circuit 106 through which the data voltage is sent). Therefore, the present invention is not limited to the embodiment described above.

Details of an operation example of the present invention will be described below with FIGS. 2-5; however, the present invention is not limited to the operation described below. For the purpose of clarity, pixel electrodes PXL1-PXL8 are omitted in FIGS. 2-5.

Figure 2:
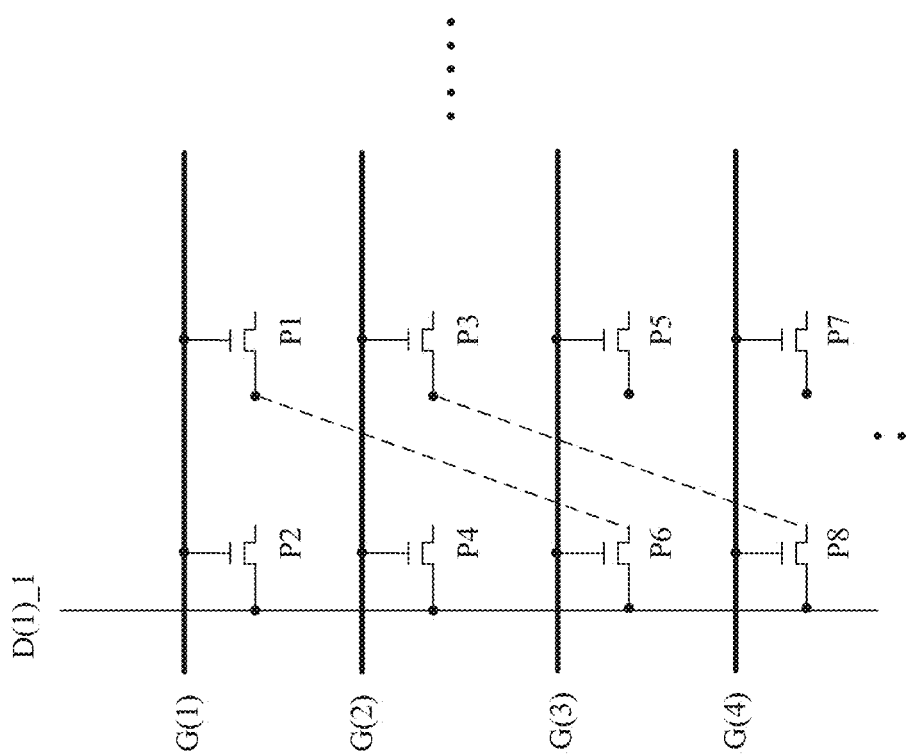
FIG. 2 illustrates a schematic view of an operation of a display device according to an operation example of the present invention.
Figure 5:
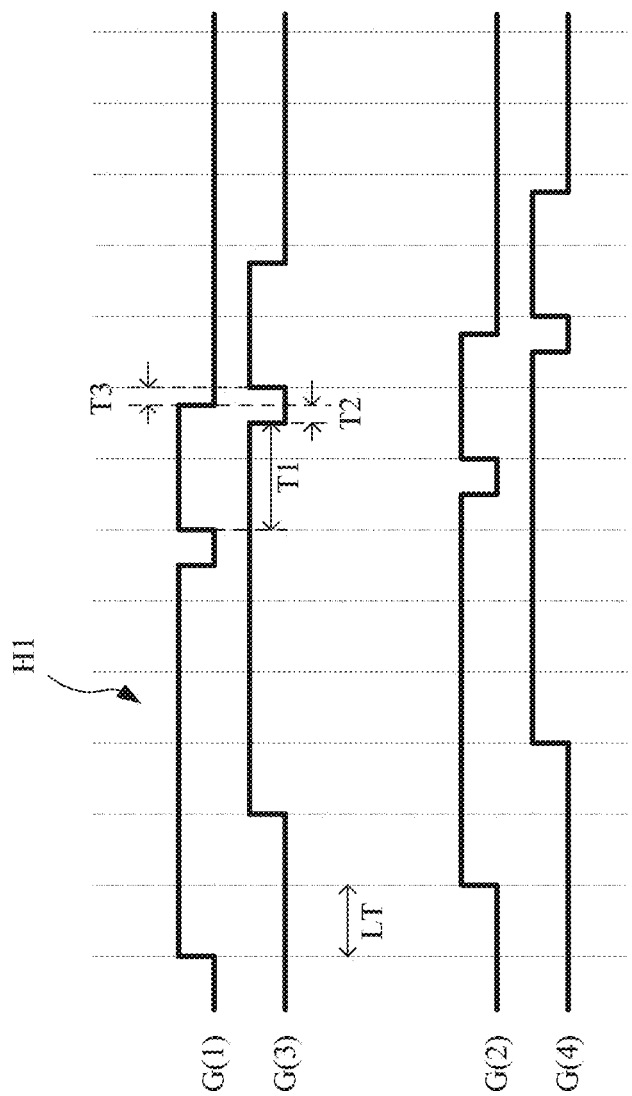
FIG. 5 illustrates a timing diagram of the signals of a display device according to an operation example of the present invention.

Refer to FIGS. 2 and 5. In the first period T1, gate signals G(1) and G(3) are both at a first voltage level (for example, high voltage level), and a data line provides data voltage D(1)_1. In this period, the switch P6 is switched on based on the gate signal G(3), so as to provide data voltage D(1)_1 from the data line to the switch P1. In this period, the switch P1 is switched on based on the rising edge of the gate signal G(1), so as to provide the data voltage D(1)_1 from the switch P6 to the pixel electrode PXL1.

In this period, the switch P5 is also switched on based on the gate signal G(3), and the switch P2 is also switched on based on the rising edge of the gate signal G(1).

Figure 3:
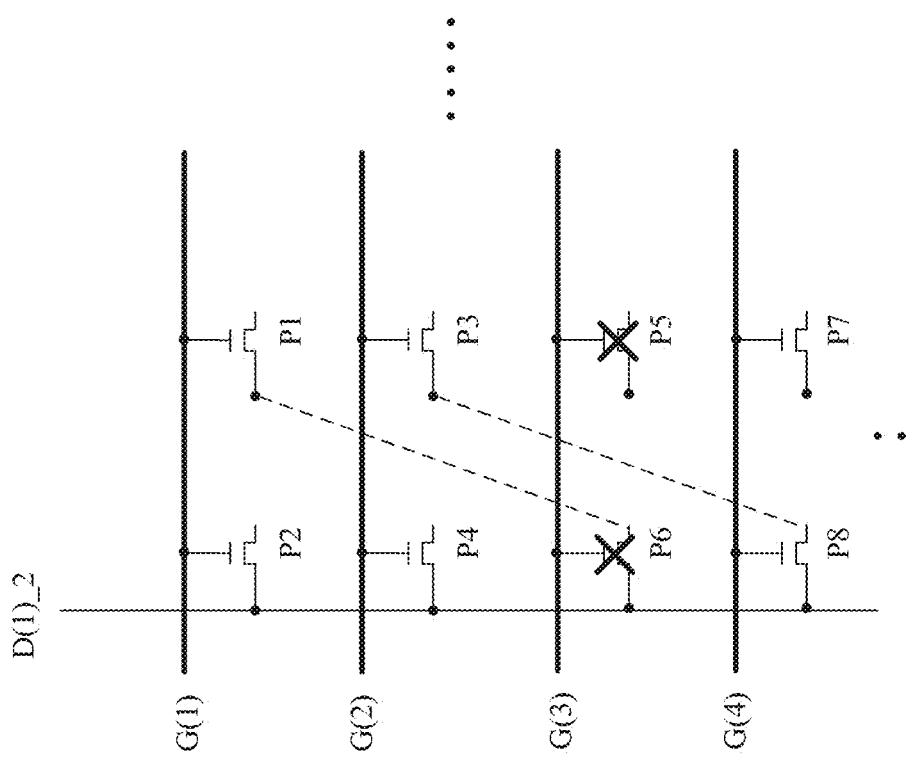
FIG. 3 illustrates a schematic view of an operation of a display device according to an operation example of the present invention.

Refer to FIGS. 3 and 5. In the second period T2, the gate signal G(1) maintains a first voltage level; the gate signal G(3) is shifted to a second voltage level (for example, a low voltage level); and the data line provides data voltage D(1)_2. In this period, the switch P1 maintains switched on based on the gate signal G(1), and the switch P6 is switched off based on the falling edge of the gate signal G(3), preventing data voltage D(1)_2 from being provided to pixel electrode PXL1. In this period, the switch P2 maintains switched on based on the gate signal G(1), in order to provide the data voltage D(1)_2 to the pixel electrode PXL2.

Figure 4:
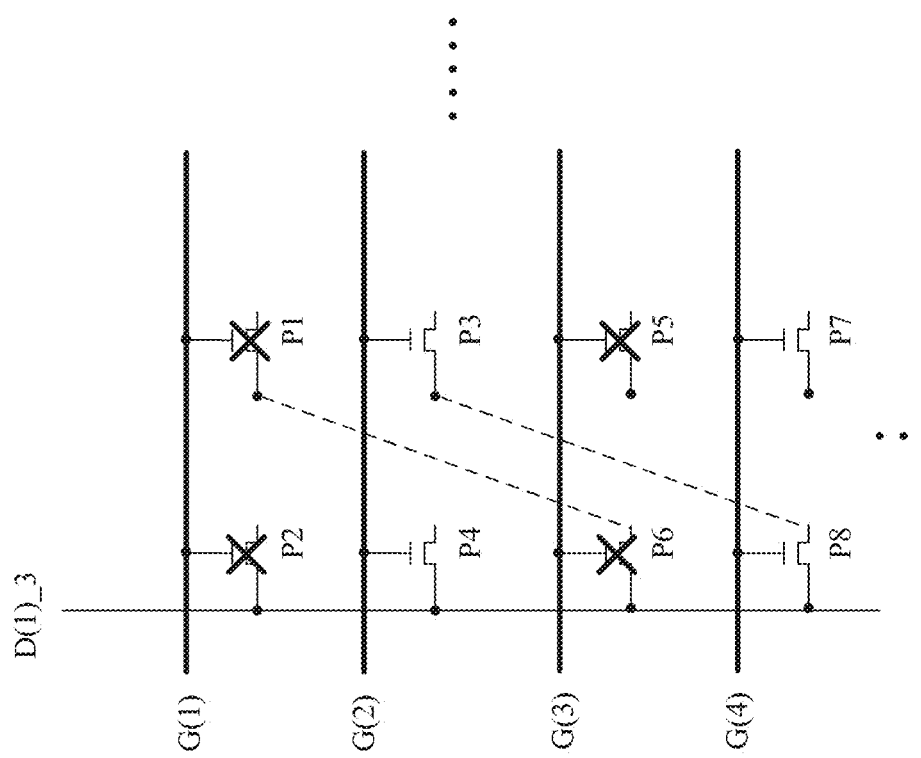
FIG. 4 illustrates a schematic view of an operation of a display device according to an operation example of the present invention.

Refer to FIGS. 4 and 5. In the third period T3, the gate signal G(1) is changed to the second voltage level, and the gate signal G(3) maintains the second voltage level. In this period, the switches P1 and P2 are switched off based on the falling edge of the gate signal G(1), preventing the data voltage D(1)_3 from being provided to the pixel electrode PXL2.

In the operations described above, in the second period T2, the data voltage D(1)_1 at the pixel electrode PXL2 has been shifted to the data voltage D(1)_2, and the data voltage D(1)_2 at the pixel electrode PXL2 is not further shifted in the third period T3. As a result, even though the switch P2 also switches on based on the rising edge of the gate signal G(1) in order to provide the data voltage D(1)_1 to the pixel electrode PXL2 in the first period T1, the pixel electrodes PXL1 and PXL2 maintain data voltages D(1)_1 and D(1)_2 (that ae different from each other) respectively.

Similarly, even though the switch P6 is also switched on to provide data voltage D(1)_1 to the pixel electrode PXL6, in the following operations, the voltage at the pixel electrode PXL6 will be shifted to the correct data voltage.

In some practices, the data voltage D(1)_1 is provided to the switch P1 through the switch P4 instead of the switch P6. This will cause the time span for providing the data voltage D(1)_1 to the switch P1 (i.e., the time span between the rising edge of the gate signal G(1) and the falling edge of the gate signal G(2)) to be less than one line time. In the process in which the gate signal G(1) shifts from the second voltage level to the first voltage level, the gate signal G(1) needs to go through a rise time before it can switch on the switch P1. Therefore, these practices tend to result in an insufficient charging time for the pixel electrode PXL1 (charged by the data voltage D(1)_1).

On the contrary, in the embodiments of the present invention described above, the time span between the gate signals G(1) and G(3) is two line times, so the time span of the first period T1 (i.e., the time span between the rising edge of the gate signal G(1) and the falling edge of the gate signal G(3)) is prolonged (for example, longer than one line time). As a result, insufficient charging time for the pixel electrode PXL1 (charged by the data voltage D(1)_1) is prevented.

It should be noted that, although in the description above, the switches P1, P2, P5, and P6 are switched on at high voltage level and switched off at low voltage level by the gate signals G(1) and G(3), the present invention is not limited thereto. In other embodiments, the switches P1, P2, P5, and P6 may be switched on at high voltage level and switched off at low voltage level by the gate signals G(1) and G(3), and the rising edge and the falling edge described above may be adjusted correspondingly.

In addition, in FIGS. 2-4, only the conducting conditions of the switches P1, P2, P5, and P6 are labeled; the conducting conditions of the switches P3, P4, P7, and P8 are not labeled. The operations of the switches P3, P4, P7, and P8 with respect to the gate signals G(2) and G(4) are similar to the operations of the switches P1, P2, P5, and P6 with respect to the gate signals G(1) and G(3) described above, and thus are not repeated herein.

It should be noted that the starting time of the first high voltage level time span H1 may be adjusted depending on actual needs. More specifically, a longer first high voltage level time span H1 may allow the gate drive circuit 110 to precharge. In different embodiments, depending on different needs, the first high voltage level time span H1 may be prolonged or shortened (as shown in FIG. 6).

Figure 6:
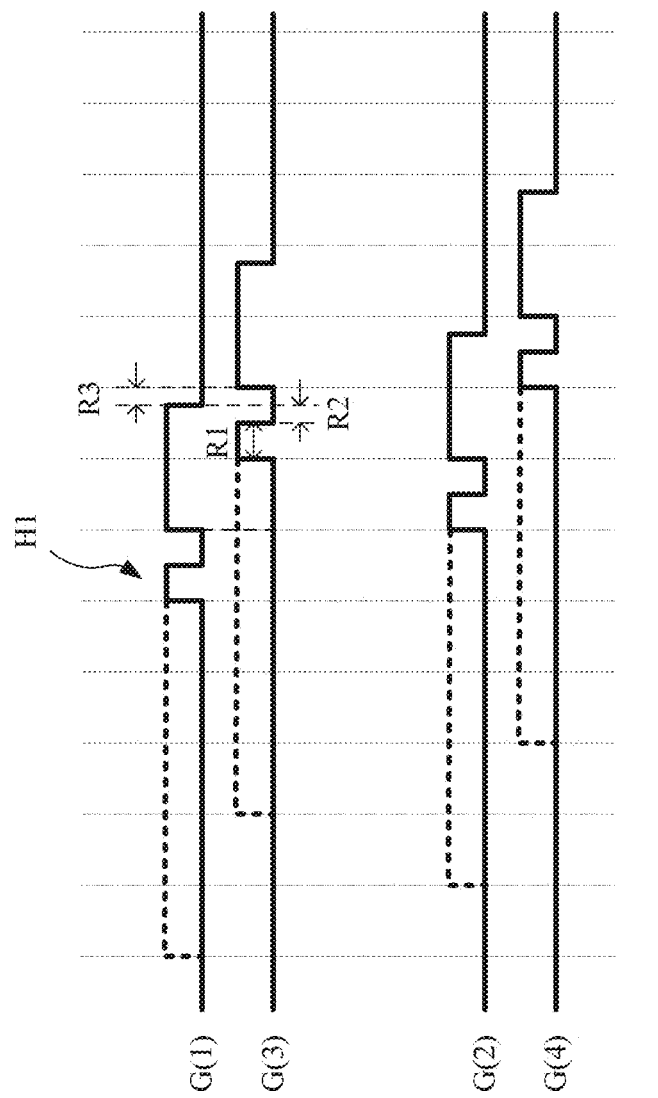
FIG. 6 illustrates a timing diagram of the signals of a display device according to another embodiment of the present invention.

In addition, in the embodiment corresponding to FIG. 6, the first high voltage level time span H1 is shortened, causing the start of the first period R1 to be correspondingly delayed. In the embodiment corresponding to FIG. 6, the operation of each of the periods R1-R3 is similar to the operation of each of the periods T1-T3 shown in FIG. 5 respectively and thus is not repeated herein.

Figure 7:
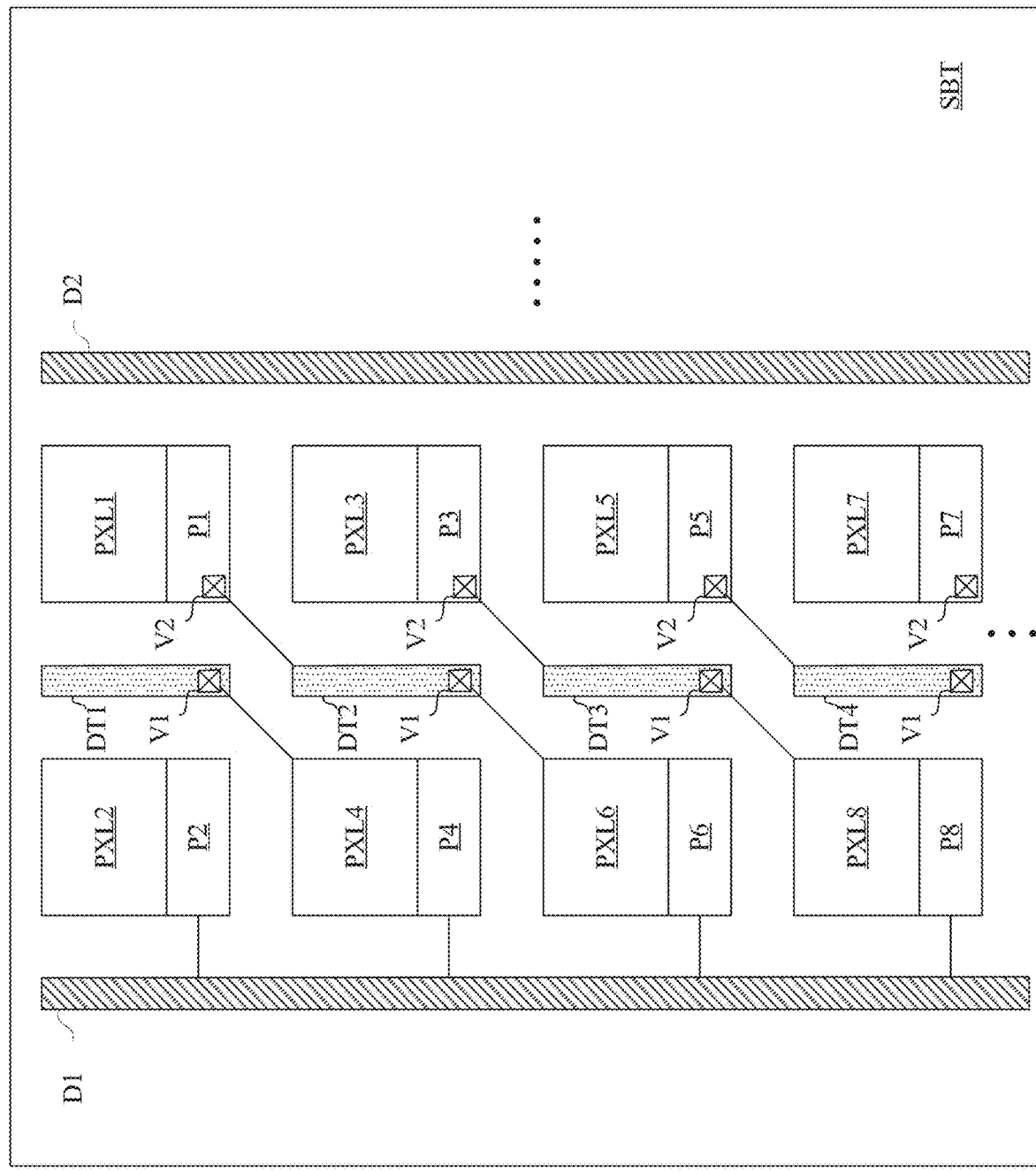
FIG. 7 illustrates a schematic view of the data lines, pixel electrodes, switches, and data transmission lines of a display device according to an embodiment of the present invention.

FIG. 7 illustrates a schematic view of data lines D1-D2, pixel electrodes PXL1-PXL8, switches P1-P8, and data transmission lines DT1-DT4 of a display device according to an embodiment of the present invention In one embodiment, the data lines D1-D2 that respectively provide data voltages D(1)-D(2), the pixel electrodes PXL1-PXL8, and the data transmission lines DT1-DT4 are disposed on the substrate SBT. In one embodiment, orthogonal projections of the pixel electrodes PXL1-PXL8 on the substrate SBT are roughly between the orthogonal projections of the data lines D1 and D2 (that are adjacent to each other) on the substrate SBT.

In one embodiment, the data transmission lines DT1-DT4 are disposed between the data lines D1 and D2 that are adjacent to each other, and the data transmission lines DT1-DT4 are parallel to the data lines D1 and D2. In one embodiment, data transmission lines DT1-DT4 are separated from each other. In one embodiment, orthogonal projections of the transmission lines DT1-DT4 on the substrate SBT are roughly between two adjacent rows of the pixel electrodes PXL1-PXL8. For example, orthogonal projection of the data transmission line DT1 on the substrate SBT is roughly between the pixel electrodes PXL1-PXL2 on the substrate SBT, and orthogonal projection of the data transmission line DT2 on the substrate SBT is roughly between the pixel electrodes PXL3-PXL4 on the substrate SBT.

In one embodiment, the data transmission lines DT1-DT4 are configured to connect two adjacent rows of pixel electrodes. For example, the data transmission line DT2 is configured to connect the pixel electrodes PXL1 and PXL6, and the data transmission line DT3 is configured to connect the pixel electrodes PXL3 and PXL8.

In one embodiment the data transmission lines DT1-DT4 may connect two adjacent rows of pixel electrodes through the vias V1 and V2. For example, the data transmission line DT2 is connected to the pixel electrode PXL6 through via V1, and is connected to the pixel electrode PXL1 through the via V2 and the switch P1. In one embodiment, one end of the via V1 is connected to the data transmission line DT2, and the other end of the via V1 is connected to the pixel electrode PXL6. In one embodiment, one end of the via V2 is connected to the data transmission line DT2, and the other end of the via V2 is connected to the switch P1. In one embodiment, the vias V1 and V2 may be implemented using vias.

Figure 8:
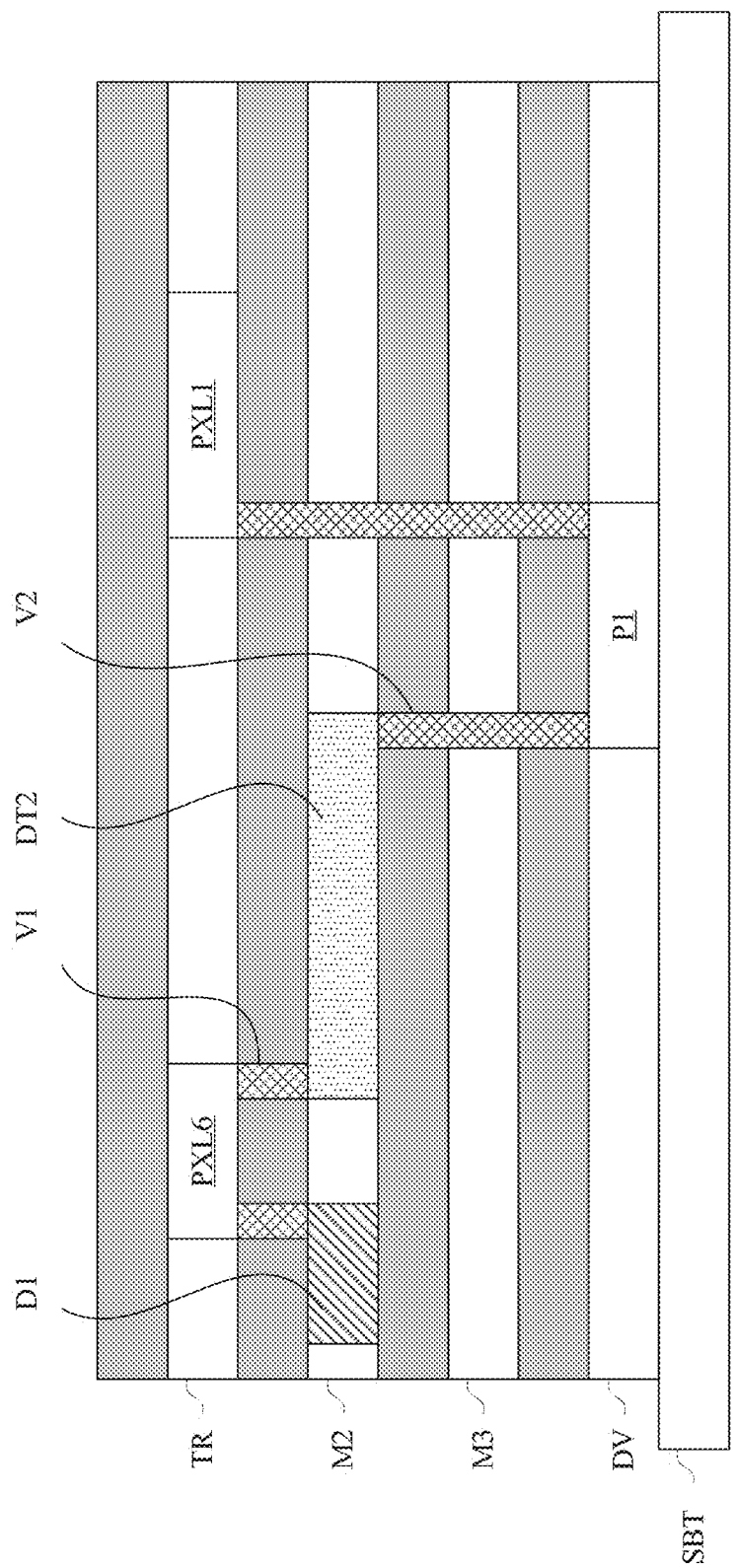
FIG. 8 illustrates a schematic view of a disposition of the vias of data transmission lines according to an embodiment of the present invention

Refer to FIG. 8. In one embodiment, the data transmission lines DT1-DT4 and the pixel electrodes PXL1-PXL8 may be located in different layers of the display device 100. In one embodiment, the pixel electrodes PXL1-PXL8 may be located in the transparent conducting layer TR; the data transmission lines DT1-DT4 may be located in the metal layer M2; and the switches P1-P8 may be located in the active device layer DV. In addition, the gate lines (not illustrated in FIG. 8) may be located in the metal layer M3.

In this embodiment, the via V1 may be disposed between the transparent conducting layer TR and the metal layer M2, so as to connect the data transmission line DT2 and the pixel electrode PXL6; and the via V2 may be disposed between the metal layer M2 and the active device layer DV, so as to connect the data transmission line DT2 and the switch P1 that is in the active device layer DV.

With the disposition described above, data voltage from the data line D1 may be delivered to the pixel electrode PXL6 by a via, to the data transmission line DT2 by the via V1, and to the pixel electrode PXL1 by another via.

It should be noted that although the data transmission lines DT1-DT4 and the data lines D1-D2 are disposed in the metal layer M2 in this embodiment, the data transmission lines DT1-DT4 and the data lines D1-D2 may be disposed in different layers in other embodiments, and the disposition of the vias V1 and V2 may be adjusted correspondingly. For example, in some other embodiments, when data transmission lines connect switches that are more than two rows apart from each other (such as switches P8 and P1), at least a portion of the data transmission lines may be disposed in metal layer(s) which do not contain the data lines.

In addition, it should be noted that although the switch P6 is connected to the switch P1 via the pixel electrode PXL6 in this embodiment, the switch P6 may be connected to the switch P1 not via pixel electrode in other embodiments. For example, the switch P6 may be connected to the switch P1 via extra trace lines in metal layer(s), so the present invention is not limited to the embodiment described above.

It should also be noted that FIG. 8 only illustrates the data transmission lines DT1-DT4 and corresponding elements in the display device 100 of one embodiment of the present invention. FIG. 8 is not an actual cross section of the display device 100 of an embodiment of the present invention, and the present invention is not limited to FIG. 8.

The present invention has been disclosed by the embodiments described above. However, those embodiments are not intended to limit the present invention. It is apparent to those skilled in the art that various modifications and variations can be made in the present invention without departing from the scope or spirit of the invention. The scope of the present invention should be defined according to the appended claims.

LIST OF REFERENCE NUMERALS

100: display device
102: pixel array
106: pixel circuit
110: gate drive circuit
120: source drive circuit
G(1)-G(N): gate signal
D(1)-D(M): data voltage P1-P8: switch
PXL1-PXL8: pixel electrode
D(1)1-D(1)3: data voltage
LT: line time
T1-T3: period
R1-R3: period
SBT: substrate
D1-D2: data line
DT1-DT4: data transmission line
V1-V2: via
TR: transparent conducting layer
M2-M3: metal layer
DV: active device layer

What is claimed is:

1. A display device, comprising:
a plurality of pixel electrodes arranged in an array;
a first switch electrically connected to a first pixel electrode of the plurality of pixel electrodes; and
a second switch electrically connected to a second pixel electrode of the plurality of pixel electrodes;
wherein the second switch is electrically connected between the first switch and a data line, the second switch is directly connected to the first switch and the data line, and the first pixel electrode and the second pixel electrode are respectively located at two rows of the pixel electrodes that are not adjacent to each other, wherein switching off of the second switch is always delayed by more than one line time with respect to a most recent switching on of the first switch, such that the first switch and the second switch are simultaneously on for longer than one line time.

2. The display device of claim 1, wherein the first switch and the second switch are electrically and respectively connected to two gate lines that are not adjacent to each other.

3. The display device of claim 1, wherein the first switch and the second switch are configured to respectively provide different data voltages that are from a same data line to the first pixel and the second pixel.

4. The display device of claim 1, wherein the timing difference between two gate signals respectively received by the control terminals of the first switch and the second switch is two line times.

5. The display device of claim 1, further comprising a third switch electrically connected to a third pixel of the plurality of the pixel electrodes, wherein the control terminals of the third switch and the first switch are connected to a same gate line.

6. The display device of claim 5, wherein in a first period:
the second switch is switched on based on a second gate signal to provide a first data voltage to the first switch; and
the first switch is switched on based on a first signal edge of a first gate signal to provide the first data voltage to the first pixel electrode.

7. The display device of claim 6, wherein in a second period:
the second switch is switch off based on a first edge of the second gate signal; and
the third switch is switched on based on the first gate signal to provide a third data voltage to the third pixel electrode.

8. The display device of claim 7, wherein the timing difference between the first signal edge of the first gate signal and the first signal edge of the second gate signal is more than one line time.

9. The display device of claim 7, wherein in a third period:
the second switch is switched off based on the second gate signal; and
the first switch and the third switch are switched off based on the first gate signal.

10. The display device of claim 1, further comprising:
a fourth switch electrically connected to a fourth pixel electrode of the plurality of pixel electrodes, wherein a gate line connecting to the control terminal of the fourth switch is located between two gate lines respectively connecting to the control terminals of the first switch and the second switch.

11. The display device of claim 10, wherein the timing difference between two gate signals respectively received by the control terminals of the first switch and the fourth switch is one line time.

12. A display device, comprising:
a substrate;
a plurality of pixel electrodes arranged in an array, wherein the array comprises two adjacent columns;
a first scan line;
a second scan line;
a third scan line; and
a first data transmission line, wherein orthogonal projection of the first data transmission line on the substrate is roughly between two adjacent pixel electrodes of the plurality of pixel electrodes,
wherein the first scan line, the second line, and the third scan line are arranged in order, wherein the plurality of pixel electrodes comprises a first pixel electrode that is located in a first row and is connected to the first scan line, a second pixel electrode that is located in a third row and is connected to the third scan line, a third pixel electrode and a fourth electrode that are located in a second row and are connected to the second scan line,
wherein the first pixel electrode and the second pixel electrode are connected via only the first data transmission line, wherein the first pixel electrode, the second pixel electrode, the third pixel electrode, and the fourth pixel electrode are located in the two adjacent columns, wherein switching off of a second switch of the second pixel electrode is always delayed by more than one line time with respect to the last switching on of a first switch of the first pixel electrode, such that the first switch and the second switch are simultaneously on for longer than one line time.

13. The display device of claim 12, further comprising a plurality of data lines, wherein the plurality of data lines are disposed roughly parallel to the first data transmission line.

14. The display device of claim 13, wherein the first data transmission line is disposed between two adjacent data lines of the plurality of data lines.

15. The display device of claim 13, wherein orthogonal projections of the first pixel electrode and the second pixel electrode on the substrate are roughly between two adjacent data lines of the plurality of data lines.

16. The display device of claim 13, wherein the first data transmission line is disposed in a same metal layer as the plurality of data lines.

17. The display device of claim 12, further comprising:
a first via configured to connect the second pixel electrode and the first data transmission line.

18. The display device of claim 17, wherein the first via is disposed between a transparent conducting layer and a metal layer.

19. The display device of claim 12, further comprising:
A second via configured to connect the first data transmission line and a switch of the second pixel electrode.

20. The display device of claim 12, further comprising:
a fifth pixel electrode of the plurality of pixel electrodes, wherein the fifth pixel electrode is located in one of the two adjacent columns and a fourth row;
a second data transmission line configured to connect the third pixel electrode and the fifth pixel electrode of the plurality of pixel electrodes;
wherein the third pixel electrode and the first electrode are located at a same column of the plurality of pixel electrodes, the fifth pixel electrode and the second electrode are located at another same column, and the second data transmission line and the first data transmission line are separated from each other.

* * * * *